United States Patent
Kobayashi et al.

(10) Patent No.: US 8,405,285 B2
(45) Date of Patent: Mar. 26, 2013

(54) PIEZOELECTRIC DEVICE, PIEZOELECTRIC ACTUATOR HAVING THE SAME, LIQUID DISCHARGE APPARATUS, AND POWER GENERATING APPARATUS

(75) Inventors: Hiroyuki Kobayashi, Ashigarakami-gun (JP); Yukio Sakashita, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 30 days.

(21) Appl. No.: 12/795,096

(22) Filed: Jun. 7, 2010

(65) Prior Publication Data

US 2010/0308692 A1    Dec. 9, 2010

(30) Foreign Application Priority Data

Jun. 8, 2009    (JP) .................. 2009-137091

(51) Int. Cl.
*H01L 41/187* (2006.01)
(52) U.S. Cl. ...................................................... 310/358
(58) Field of Classification Search .................. 310/358; 252/62.9 R, 62.9 PZ
See application file for complete search history.

(56) References Cited

U.S. PATENT DOCUMENTS

| | | | |
|---|---|---|---|
| 2006/0022555 A1* | 2/2006 | Balasubramaniam et al. | 310/339 |
| 2007/0241642 A1* | 10/2007 | Miyazawa et al. | 310/358 |
| 2008/0074471 A1* | 3/2008 | Sakashita et al. | 347/68 |
| 2010/0103226 A1 | 4/2010 | Sakashita et al. | |

FOREIGN PATENT DOCUMENTS

WO    2008/088086 A1    7/2008

OTHER PUBLICATIONS

Kazuo Nakamae, et al., "Development of High Resolution and Wide Band Piezoelectric Composite for Ultrasonic Probe", SEI Technical Review, Sep. 2003, pp. 48-52, vol. 163.

Mitsuyoshi Matsushita, et al., "Development of Large Diameter Piezo-single Crystal PMN-PT of High Energy Transfer Efficiency", JFE Technical Report, Jun. 2005, pp. 43-48, No. 8.

R.D. Shannon, "Revised Effective Ionic Radii and Systematic Studies of Interatomic Distances in Halides and Chalcogenides", Acta Crystallogr, A32, 1976, pp. 751-767.

Yasuharu Hosono, et al., "High-Efficiency Piezoelectric Single Crystals", Toshiba Review, 2004, pp. 39-42, vol. 59, No. 10.

Hirotake Okino, et al., "Electric-Field-Induced Displacements in Pt/PZT/Pt/SiO2/Si System Investigated by Finite Element Method: Material-Constant Dependences", Mater. Res. Soc. Symp. Proc., 2006, pp. T03-49.1-T03-49.6., vol. 902E.

* cited by examiner

*Primary Examiner* — Derek Rosenau
(74) *Attorney, Agent, or Firm* — Sughrue Mion, PLLC

(57) ABSTRACT

A piezoelectric device which includes a piezoelectric body having piezoelectricity and a pair of electrodes for applying an electric field to the piezoelectric body in a predetermined direction in which a piezoelectric strain constant $d_{33}$ (pm/V) and a relative pemittivity $\varepsilon_{33}$ of the piezoelectric body satisfy Formulae (1) and (2) below. This makes the piezoelectric device excellent both in transmission and reception capabilities and appropriate for use as a piezoelectric actuator, a sensor, an ultrasonic sensor, or a power generating device.

$$100 < \varepsilon_{33} < 1500 \qquad (1)$$

$$d_{33}(\text{pm/V}) > 12\sqrt{\varepsilon_{33}} \qquad (2).$$

5 Claims, 9 Drawing Sheets

$(Ba_{0.3},Bi_{0.7})(Ti_{0.29},Fe_{0.66},Mn_{0.05})O_3$ on SRO/STO

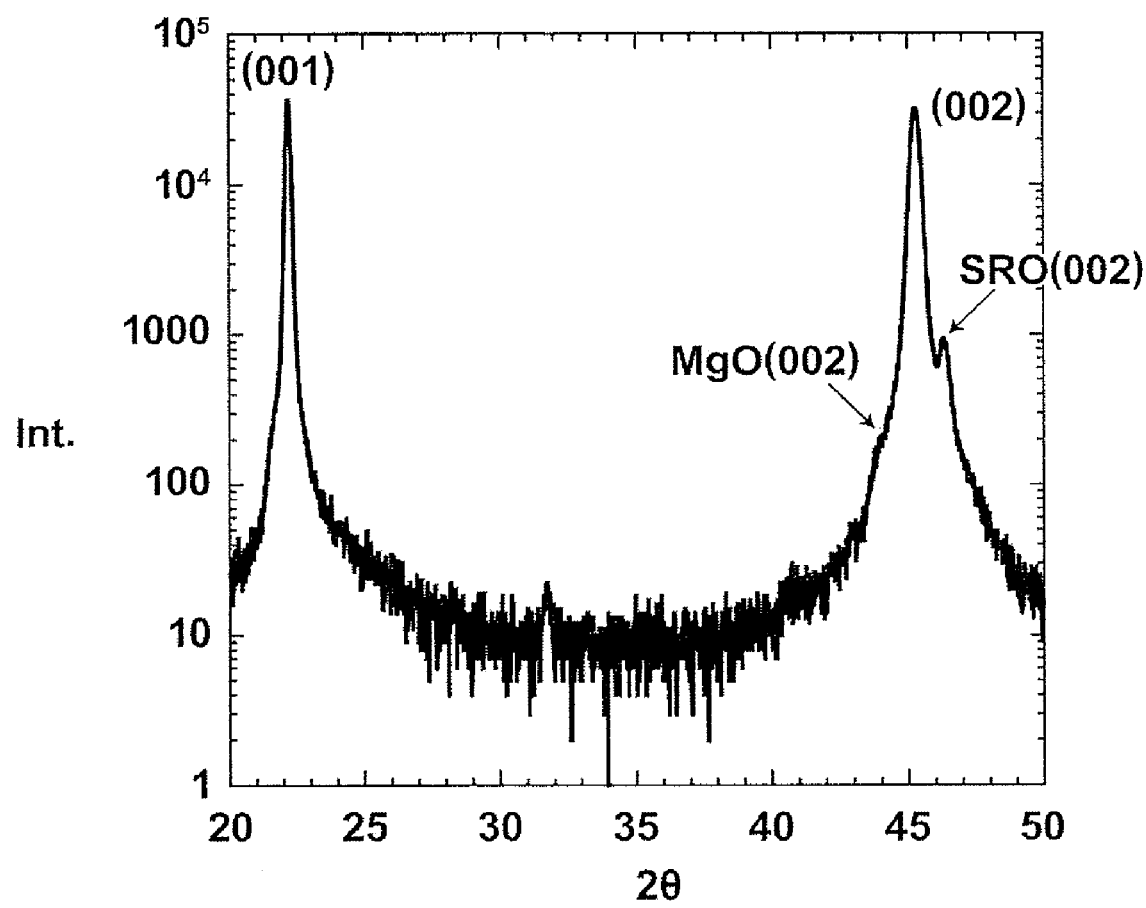

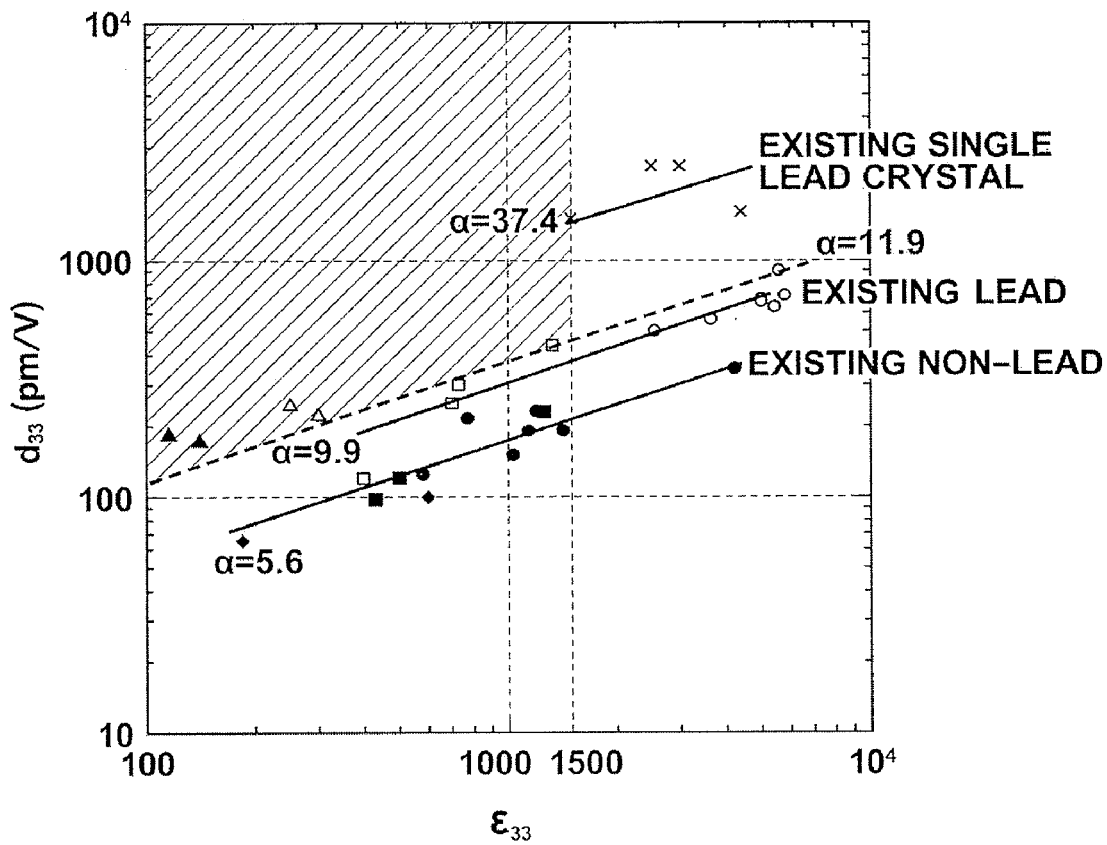

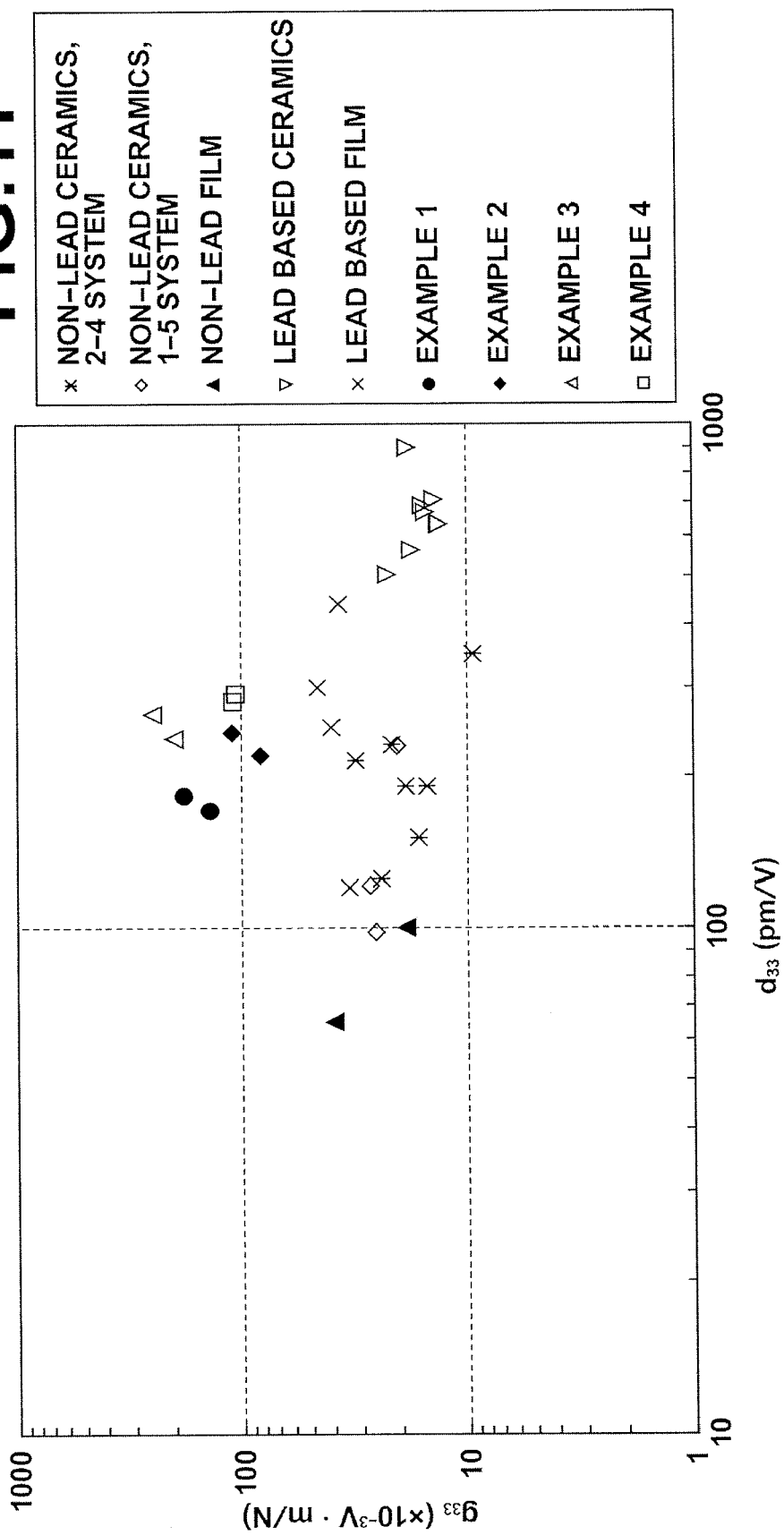

PIEZOELECTRIC DEVICE, PIEZOELECTRIC ACTUATOR HAVING THE SAME, LIQUID DISCHARGE APPARATUS, AND POWER GENERATING APPARATUS

BACKGROUND OF THE INVENTION

1. Field of the Invention

The present invention relates to a piezoelectric actuator and liquid discharge apparatus having a piezoelectric device and a driver for driving the piezoelectric device, and a power generating apparatus having a piezoelectric device.

2. Description of the Related Art

Piezoelectric materials can mutually convert the electrical energy and mechanical energy by their own intrinsic functions (properties). As having excellent properties in the electromechanical mutual conversion and as mechanical vibrating bodies, piezoelectric materials are widely applied to frequency control, such as frequency filters and the like, and electronics components for telecommunication. Further, in the field of mechatronics, the electromechanical mutual conversion function of piezoelectric materials has gained recognition along with the integration and miniaturing technologies.

Generally, a piezoelectric strain constant (piezoelectric d-constant) and a voltage output constant (piezoelectric g-constant) are used as indices for indicating the performance of piezoelectric materials (piezoelectric performance). The d-constant is an index representing the amount of strain per unit electric field (transmission capability), and a higher d-constant indicates a higher performance as an actuator used in an inkjet recording head and the like. The g-constant is an index representing a field intensity generated per unit stress (reception capability), and a higher g-constant indicates a higher performance as a sensor.

In general electric field induced strain in which, when the vector component of spontaneous polarization axis corresponds to electric field application direction, expansion or contraction occurs according to increase or decrease in the strength of applied electric field, the following holds true. That is, $d = k\sqrt{\epsilon_0}\sqrt{\epsilon}\cdot\sqrt{s}$, $g = d/\epsilon_0\epsilon$ (k is the electromechanical coupling coefficient, $\epsilon_o$ is the vacuum permittivity, $\epsilon$ is the relative permittivity, and s is the elastic compliance). Thus, in the general electric field induced strain, either of the two constants becomes greater for a higher electromechanical coupling coefficient. Therefore, in the field of either actuators or sensors, piezoelectric materials having high electromechanical coupling coefficients are sought.

As an attempt to increase electromechanical coupling coefficient, a literature by K. Nakamae et al., "Development of High Resolution and Wide Band Piezoelectric Composite for Ultrasonic Probe", SEI Technical Review, September, Vol. 163, pp. 48-52, 2003 (Non-patent Document 1) describes a composite piezoelectric material for ultrasonic sensors having a composite structure of a polymer and a plurality of bar-like bulk bodies of lead zirconate titanate (PZT) disposed in the polymer in parallel with each other to alleviate the mechanical constraints by the flexibility of the resin, thereby effectively extracting vibrations in the thickness direction. In the method of producing a composite structure, as in Non-patent Document 1, the manufacturing process becomes complicated and the piezoelectric performance may possibly be degraded due to the polymer portion. Thus, it is preferable that a piezoelectric material itself has a high electromechanical coupling coefficient.

A literature by M. Matsushita et al., "Development of Large Diameter Piezo-single Crystal PMN-PT of High Energy Transfer Efficiency", JFE Technical Report, No. 8, pp. 43-48, June, 2005 (Non-patent Document 2) has succeeded in increasing the electromechanical coupling coefficient through bulk single crystallization of a solid solution of $Pb(Zn,Nb)O_3$ and $PbTiO_3$.

Application of materials having both a high d-constant and a high g-constant to ultrasonic sensors and power generating devices are also expected. In ultrasonic sensors, a piezoelectric material having well-balanced transmission capability and reception capability is preferable, while in power generating devices, the product of d-constant and g-constant of a piezoelectric material serves as the performance index. The d-constant takes a large value for a high permittivity while d-constant takes a small value for a high permittivity, as shown in the formulae above, Consequently, the material (PZT-PT) of Non-Patent Document 2 having both a high electromechanical coupling coefficient and a high permittivity may provide a high value for the d-constant but not for the g-constant.

The present invention has been developed in view of the circumstances described above, and it is an object of the present invention to provide a piezoelectric device having excellent transmission and reception capabilities, and is favorably used as an ultrasonic sensor or a power generating device, as well as a piezoelectric actuator or a sensor. It is a further object of the present invention to provide a piezoelectric actuator, a liquid discharge apparatus, and a power generating apparatus, each having the piezoelectric device described above.

SUMMARY OF THE INVENTION

A piezoelectric device of the present invention is a device, including a piezoelectric body having piezoelectricity and a pair of electrodes for applying an electric field to the piezoelectric body in a predetermined direction, wherein a piezoelectric strain constant $d_{33}$ (pm/V) and a relative permittivity $\epsilon_{33}$ of the piezoelectric body satisfy Formulae (1) and (2) below.

$$100 < \epsilon_{33} < 1500 \qquad (1)$$

$$d_{33}(\text{pm/V}) > 12\sqrt{\epsilon_{33}} \qquad (2)$$

where, the first and second subscripts in $d_{33}$ and $\epsilon_{33}$ designate an application direction of the electric field and a strain direction respectively when three orthogonal axes 1, 2, and 3 are defined, thereby indicating a longitudinal vibration mode in which a strain or stress extracting direction is parallel to an application direction of the electric field. Accordingly, $d_{33}$ and $\epsilon_{33}$ are a piezoelectric strain constant and a permittivity in a longitudinal vibration mode.

Preferably, in the piezoelectric device of the present invention, the piezoelectric body is formed of one or more types of perovskite oxides, which may include an unavoidable impurity, represented by General Formula $ABO_3$ (in General Formula $ABO_3$, A and B represent an A-site element and a B-site element respectively, each being one or more types of metal elements, and O represents an oxygen atom, and although a ratio of a total molar amount of the A-site element or of the B-site element to a molar amount of the oxygen atoms is normally 1:3, the ratio may deviate from 1:3 within a range in which a perovskite structure can be obtained).

Here, it is preferable that the A-site element A includes Bi. It is also preferable that the piezoelectric body is formed of one or more types of perovskite oxides, which may include an unavoidable impurity, represented by General Formula (P)

below. Such composition may provide a piezoelectric device that satisfies Formulae (3) and (4) below.

$$(Ba,Bi,A)(Ti,Fe,M)O_3 \quad (P)$$

$$100<d_{33}(pm/V) \quad (3)$$

$$80<g_{33}(\times 10^{-3} V \cdot m/N) \quad (4)$$

In General Formula (P), Ba, Bi, and A are A-site elements and Ti, Fe, and M are B-site elements, each of A and M being one or more types of metal elements other than Pb.

Although a ratio of a total molar amount of the A-site elements or of the B-site elements to a molar amount of the oxygen atoms is normally 1:3, the ratio may deviate from 1:3 within a range in which a perovskite structure can be obtained. In Formula (4) above, $g_{33}$ is a voltage output constant (piezoelectric sensitivity constant) of the piezoelectric body. Further, the one or more types of perovskite oxides satisfy Formula (5) below. Still further, it is preferable that, in General Formula (P), when the A-site element A is Ba and/or Bi, the B-site element M is an element other than Ti and Fe, while when the B-site element M is Ti and/or Fe, the A-site element A is an element other than Ba and Bi, and the one or more types of perovskite oxides represented by General Formula (P) satisfy Formulae (5) and (6) below, and more preferably satisfy Formula (7) below.

$$0.97 \leq TF(P) \leq 1.02 \quad (5)$$

$$TF(BiFeO_3)<TF(AMO_3)<TF(BaTiO_3) \quad (6)$$

$$0.97 \leq TF(AMO_3) \leq 1.02 \quad (7)$$

(In Formulae (5) to (7), TF(P) is a tolerance factor of the one or more types of perovskite oxides represented by General Formula (2) above, $TF(BiFeO_3)$ $TF(AMO_3)$, and $TF(BaTiO_3)$ are tolerance factors of the oxides in parentheses respectively.) Preferably, the piezoelectric body includes a plurality of components having different crystal systems. It is also preferable that piezoelectric body does not include Pb.

The term "tolerance factor" as used herein refers to a factor represented by a formula below.

$$TF=(rA+rO)/\sqrt{2}(rB+rO)$$

where, rA is an A-site average ion radius, rB is a B-site average ion radius, and rO is an oxygen ion radius. The term "ion radius" as used herein refers to a so-called Shannon ion radius (R. D. Shannon, "Revised Effective Ionic Radii and Systematic Studies of Interatomic Distances in Halides and Chalcogenides", Acta Crystallogr, A32, p. 751-767, 1976). The term "average ion radius" as used herein refers to a quantity represented by ΣCiR, in which C is a molar fraction of lattice site ions and R is an ion radius. "A covalent bonding radius" is used for the ion radius of 12-coordinate Bi, because it is not described in the aforementioned document and such Bi has strong covalent bonding.

Preferably, the A-site element A is Sr. When the B-site element M is an element other than Ti and Fe, the A-site element A may be Bi, Ba, or a solid solution of Bi and Ba. Further, when the A-site element A is an element other than Ba and Bi, the B-site element M may be Ti, Fe, or a solid solution of Ti and Fe.

The tolerance factor of each of $BaTiO_3$, $BiFeO_3$, $AMO_3$, and a perovskite oxide represented by General Formula (P) above is theoretically obtained (TF $(BaTiO_3)$=1.062, TF $(BiFeO_3)$=0.989).

In this case, the tolerance factor of an oxide which can not take a perovskite structure is also obtained theoretically. Then, the composition of General Formula (P) is determined so as to satisfy the specified relationship described above.

Preferably, in the piezoelectric device of the present invention, the piezoelectric body is a <100> or <001> uniaxial orientation poly or single crystal. The term "uniaxial orientation crystal" as used herein refers to a crystal having a single crystal orientation in a thickness direction without regard of an in-plane direction of the crystal. Further, the tetra also refers to a crystal having a single crystal orientation in a thickness direction and an in-plane direction. When the piezoelectric body is a piezoelectric film, a triaxial orientation epitaxal film is also regarded as the single crystal. The term "single crystal orientation" as used herein refers to a crystal orientation with an orientation factor F of not less than 80% measured by Lotgerling method. The orientation factor F is represented by the formula below.

$$F(\%)=(P \times P0)/(1-P0) \times 100 \quad (i)$$

where, P is a ratio between a total reflection intensities from the orientation plane and a total of the entire reflection intensities. In the case of (001) orientation, P is a ratio between a total ΣI (001) of reflection intensities I (001) from the orientation plane and a total ΣI (hkl) of reflection intensity I (hkl) fromeachcrystalplane (hkl) (ΣI (001)/ΣI (hkl)). For example, with respect to a (001) oriented perovskite crystal, P=I(001)/[I(001)+I(100)+I(101)+I(110)+I(111)]. P0 is P of a sample having a completely random orientation. In a case of a completely random orientation (P=P0), F=0%, while in a case of a complete orientation (P=1), F=100%.

When the piezoelectric body is a piezoelectric film formed on a substrate, it is preferable that the film is a piezoelectric film with a thickness of 1 μm to 100 μm. In this case, it is more preferable that the substrate is a single crystal substrate.

When the piezoelectric body is a bulk body, it may be a particle oriented ceramics sintered body.

A piezoelectric actuator of the present invention is an actuator, including the piezoelectric device of the present invention described above, and a driver for driving the piezoelectric device by applying an electric field to the piezoelectric body of the piezoelectric device.

A liquid discharge apparatus of the present invention is an apparatus, including the piezoelectric actuator of the present invention described above and a liquid discharge member provided adjacent to the piezoelectric actuator, in which the liquid discharge member has a liquid storage chamber for storing a liquid and a liquid discharge opening for discharging the liquid from the liquid storage chamber to the outside according to the application of the electric field to the piezoelectric body.

A power generating apparatus of the present invention is an apparatus, including the piezoelectric device of the present invention described above, a vibration plate, provided in a lower layer of the piezoelectric body, for conveying an external force to the piezoelectric body to displace the body, and an extraction electrode for extracting a charge generated in the piezoelectric body by the displacement from the pair of electrodes.

The piezoelectric device of the present invention includes a piezoelectric body having a piezoelectric strain constant $d_{33}$ (pm/V) and a relative permittivity $\epsilon_{33}$ that satisfy Formulae (1) and (2) below.

$$100<\epsilon_{33}<1500 \quad (1)$$

$$d_{33}(pm/V)>12\sqrt{\epsilon_{33}} \quad (2)$$

As described under the "Description of the Related Art", it has been difficult to obtain both a high $d_{33}$ value and a high $g_{33}$ value, but the present invention having the configuration described above has succeeded, for the first time, in obtaining a high $d_{33}$ value without increasing the permittivity. The piezoelectric device of the present invention includes a piezoelectric body having a high $d_{33}$ value at a low permittivity, that is, having both a superior $d_{33}$ value and a voltage output constant $g_{33}$ value in comparison with conventional piezoelectric bodies, so that the piezoelectric device is excellent in both transmission and reception capabilities. Therefore, the present invention may provide a piezoelectric device appropriate for use as a piezoelectric actuator, a sensor, an ultrasonic sensor, or a power generating device.

It is known that the smaller the relative permittivity and the higher the piezoelectric constant of a piezoelectric device, the smaller the power consumption of the device. Accordingly, the present invention may provide a high performance and a high efficient piezoelectric device.

Further, the piezoelectric device of the present invention may include a piezoelectric body formed of a Pb-free perovskite oxide. It is considered to be preferable to avoid the use of Pb in electrical and electronic devices as much as possible due to its harmful effects. Therefore, the configuration of piezoelectric device of the present invention is also preferable from the viewpoint of reduction of environmental burden.

BRIEF DESCRIPTION OF THE DRAWINGS

FIG. 9 illustrates XRD results of a piezoelectric body of Example 2.

FIG. 10 illustrates the relationship between the permittivity and piezoelectric strain constant of piezoelectric devices of Examples and existing piezoelectric devices made of lead-based and non-lead based materials.

FIG. 11 illustrates the relationship between the piezoelectric strain constant and voltage output constant of piezoelectric devices of Examples and existing piezoelectric devices made of lead-based and non-lead based materials.

DESCRIPTION OF THE PREFERRED EMBODIMENTS

Piezoelectric Device, Piezoelectric Actuator, and Inkjet Recording Head

Figure 1:
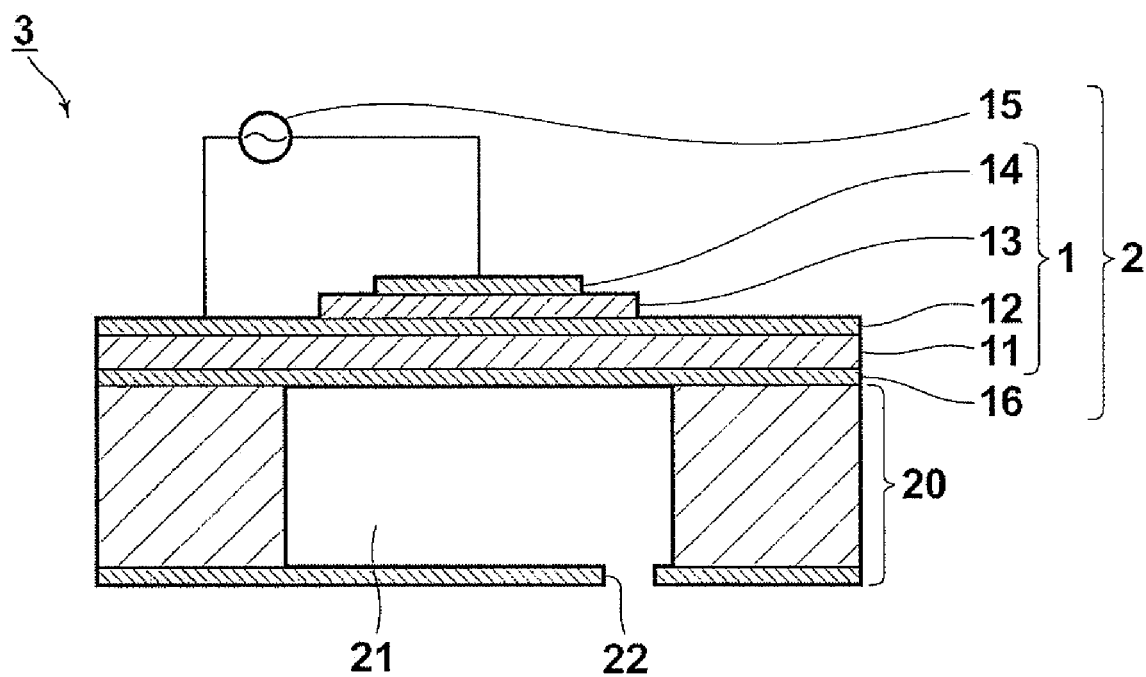
FIG. 1 is a cross-sectional view of a relevant part of a piezoelectric device and an inkjet recording head (liquid discharge apparatus) having the piezoelectric device according to an embodiment of the present invention, illustrating the structure thereof.

Hereinafter, structures of a piezoelectric device, a piezoelectric actuator (piezoelectric apparatus) having the piezoelectric device, and an inkjet recording head (liquid discharge apparatus) according to embodiments of the present invention will be described. FIG. 1 is a cross-sectional view of a relevant part of an inkjet recording head according to an embodiment of the present invention (cross-sectional view in a thickness direction of the piezoelectric device). Each of the components is not necessarily drawn to scale for facilitating visibility.

Piezoelectric device 1 shown in FIG. 1 is a device having substrate 11 on which lower electrode 12, piezoelectric body 13, and upper electrode 14 are stacked on top of each other. Piezoelectric body 13 is formed of an inorganic compound crystal having a piezoelectricity, and an electric field is applied in a thickness direction by lower electrode 12 and upper electrode 14.

There is not any specific restriction on substrate 11, but, when piezoelectric body 13 is formed of a perovskite oxide, which may include an unavoidable impurity, a substrate of a perovskite single crystal, such as strontium titanate or the like, is preferable because it has good lattice matching with each layer to be stacked, such as piezoelectric body 13, and the orientation can be controlled easily. Other types of substrates preferably used as substrate 11 include substrates of silicon, glass, stainless (SUS), yttrium-stabilized zirconia (YSZ), alumina, sapphire, silicon carbide, and the like. Further, as for substrate 11, a laminated substrate, such as a SOI substrate which includes a silicon substrate on which a $SiO_2$ film and a Si active layer are stacked in this order may also be used.

There is not any specific restriction on the major component of lower electrode 12, and a metal, such as Au, Pt, Ir, $IrO_2$, $RuO_2$, $LaNiO_3$, or $SrRuO_3$, a metal oxide, or a combination thereof may be used. A metal oxide electrode having a perovskite structure, such as $LaNiO_3$ or $SrRuO_3$ is preferable because, as in the substrate, it has good lattice matching with each layer to be stacked and the orientation can be controlled easily. In the present embodiment, a configuration is adopted in which a piezoelectric actuator is provided with vibration plate 16, but lower electrode 12 may also have a function as a vibration plate.

There is not any specific restriction on the major component of upper electrode 14, and example materials described in lower electrode 12, electrode materials generally used in a semiconductor process, such as Al, Ta, Cr, Cu, and the like, and a combination thereof may be used.

There is not any specific restriction on the thickness of each of lower electrode 12 and upper electrode 14, but requires a minimum thickness to have a conductivity for effectively applying an electric field to piezoelectric body 13 as an electrode. The thickness may be determined based on the electric conductivity and entire size of piezoelectric device 1 and is preferable, for example, to be in the range from 50 to 500 nm. Further, each electrode may have a multilayer structure.

Further, piezoelectric device 1 may further include various types of buffer layers for controlling the crystalline and orientation of piezoelectric body 13 and improving adhesion of each layer. Preferably, a buffer layer has a lattice constant which is within a difference range of less than 8% of that of the substrate or underlayer.

Piezoelectric actuator (piezoelectric apparatus) 2 includes piezoelectric device 1 and vibration plate 16 which is attached to the rear surface of substrate 11 of piezoelectric device 13 and vibrates with the expansion/contraction of piezoelectric body 13. Piezoelectric actuator 2 further includes driver 15, such as a drive circuit for driving piezoelectric device 1 or the like. There is not any specific restriction on the driving condition for piezoelectric body 13 by driver 15.

Inkjet recording head (liquid discharge apparatus) 3 according to the present embodiment is basically formed of piezoelectric actuator 2 and an ink nozzle (liquid storage/discharge member) 20, having an ink chamber (liquid storage chamber) 21 for storing an ink and an ink discharge opening 22, attached to the rear surface of piezoelectric actuator 2. In inkjet recording head 3, the electric field applied to piezoelectric device 1 is increased or decreased to cause device 1 to expand or contract, whereby ink discharge from ink chamber 21 and the amount of the discharge are controlled.

Instead of attaching vibration plate 16 and ink nozzle 20 made of a separate member to substrate 11, portions of substrate 11 may be formed into vibration plate 16 and ink nozzle 20. For example, where substrate 11 is a laminated substrate, such as a SOI substrate, ink storage chamber 21 may be formed by etching substrate 11 from the rear side, and vibration plate 16 and ink nozzle 20 may be formed by processing the substrate itself.

Preferably, piezoelectric body 13 is a piezoelectric film with a thickness of 1 μm to 10 μm. In actuator applications, such a film thickness allows an effective electric field for driving the actuator to be provided without requiring a special driving power source.

There is not any specific restriction on the orientation of piezoelectric body 13, but it is preferable that piezoelectric body 13 is formed of a <100> or <001> uniaxial orientation poly or single crystal (including an epitaxial film), because it can provide improved properties.

A determination as to whether or not piezoelectric body 13 has a uniaxial orientation may be made by X-ray diffraction. For example, in the case of a <100> single crystal (epitaxial film), peaks caused by the piezoelectric body in 2θ/θ measurement using X-ray diffraction are detected only on the {L00} planes (L=1, 2, 3, - - - , n; n is an integer), such as {100}, {200}, and the like. Further, when a pole measurement for the {110} asymmetric plane is conducted, a four-hold symmetric spot-like pattern is obtained every 90° at the same radial positions representing slopes of about 45° from the center.

In piezoelectric body 13 of a <100> uniaxial orientation crystal that shows eight-hold or twelve-hold pattern at the same radial positions representing slopes of about 45 degrees from the center, or spots of an ellipsoidal pattern are conceivable. These crystals have a symmetric property which is intermediate between a single crystal and a uniaxial crystal of the present embodiment, and, therefore, are regarded, in a broad sense, as single crystals and single axis oriented crystals. Further, when a crystal due to twin crystal formation is mixedly present or when a crystal has a transition, a defect, or the like, such crystal is regarded, in a broad sense, as a single crystal and a uniaxial crystal.

There is not any specific restriction on the method of forming piezoelectric body 13 as long as it is capable of controlling the composition of piezoelectric body 13, to be described later, and controlling the crystal orientation, since it is preferable that piezoelectric body has a crystal orientation as described above. Methods that can form such films include known thin film forming methods including gas phase methods, such as sputtering, MOCVD, CVD, MBE, and pulse laser deposition (PLD), and liquid phase methods, such as sol-gel method, hydrothermal synthesis method, and metalorganic decomposition. When piezoelectric body 13 is formed into a uniaxial crystal or an epitaxial film by appropriately performing orientation control, it is preferable to use a substrate and an electrode, as substrate 11 and lower electrode 12, having good lattice matching with piezoelectric body 13 and a good orientation, as described above. Preferable combinations of the lower electrode/substrate that allow the formation of an epitaxial film may include, for example, $SrRuO_3/SrTiO_3$, Pt/MgO, SRO/MgO/Si, and the like.

In the present embodiment, piezoelectric body 13 has a piezoelectric strain constant $d_{33}$ (pm/V) and a relative permittivity $\epsilon_{33}$ that satisfy Formulae (1) and (2) below.

$$100 < \epsilon_{33} < 1500 \quad (1)$$

$$d_{33}(pm/V) > 12\sqrt{\epsilon_{33}} \quad (2)$$

Piezoelectric strains may include the following:

(1) an ordinary piezoelectric strain in which expansion or contraction occurs in a direction of applied electric field when the vector component of spontaneous polarization axis corresponds to the direction of applied electric field according to the increase or decrease in applied electric field intensity (intrinsic piezoelectric strain);

(2) a piezoelectric strain produced by increasing or decreasing the electric field intensity and reversibly rotating the polarization axis by non-180°;

(3) a piezoelectric strain caused by the change in volume due to crystal phase transitions induced by increasing or decreasing the electric field intensity; and (4) a piezoelectric strain that makes use of engineered domain effect, which is capable of providing a larger strain, obtained by using a material having a property to cause phase transitions by the application of an electric field and forming a crystal orientation structure containing a ferroelectric phase having crystal orientation in a direction different from the spontaneous polarization direction (when making use of the engineered domain effect, the piezoelectric body may be driven under the condition in which phase transitions occur or under the condition in which phase transitions do not occur).

The piezoelectric strain in (1) above is an intrinsic piezoelectric strain, while the piezoelectric strains in (2) to (4) are extrinsic piezoelectric strains. In each of the piezoelectric strains described in (1) to (4) above, a large piezoelectric strain may be obtained by forming the piezoelectric body to have a composition and a crystal orientation structure according to the strain generation mechanism. The piezoelectric strains described in (1) to (4) above may be used individually or in combination.

As described under the "Description of the Related Art", in piezoelectric devices, the d-constant is an index representing the amount of strain per unit electric field (transmission capability) and g-constant is an index representing a field intensity generated per unit stress (reception capability).

Generally, the piezoelectric strain constant $d_{33}$ (pm/V) and relative permittivity $\epsilon_{33}$ in the longitudinal vibration mode of the ordinary electric field induced piezoelectric strain in (1) above (intrinsic piezoelectric strain) are in the relationship of $d_{33}=k_{33}\sqrt{s}\sqrt{\epsilon_0}\sqrt{\epsilon_{33}}$, and it is known that $g_{33}=d_{33}/\epsilon_0\epsilon_{33}$. That is, in the intrinsic piezoelectric strain, it is known that, when $a=k_{33}\sqrt{s}\sqrt{\epsilon_0}$, $d_{33}$ is proportional to $\sqrt{\epsilon_{33}}$ while $g_{33}$ is inversely proportional to $\sqrt{\epsilon_{33}}$ ($k_{33}$ is the electromechanical coupling coefficient, $\epsilon_0$ is the vacuum permittivity ($N/V^2$), and s is the elastic compliance ($m^2/N$)).

Further, in the known lead based or non-lead based materials which have been developed so far and those capable of providing high intrinsic piezoelectric strains which have been invented and disclosed by the present inventors, it is confirmed that $d_{33}$ is substantially proportional to $\sqrt{\epsilon_{33}}$ (FIG. 10).

After studying material design, manufacturing method, crystal orientation, and the like for achieving the objects of the present invention, the present inventors have succeeded in obtaining a piezoelectric device 1 which is excellent in both $d_{33}$ and $g_{33}$ values and both transmission and reception capabilities, as shown in Examples to be described later, by forming, as piezoelectric device 1, a piezoelectric device which, while having the same permittivity $\epsilon_{33}$, has a larger $d_{33}$ value in comparison with conventional materials, deviating largely from linear lines shown in FIG. 10, that is, by forming a piezoelectric device that satisfies Formulae (1) and (2) above (FIGS. 10 and 11).

It is known that the smaller the relative permittivity $\epsilon_{33}$ and the higher the piezoelectric constant $d_{33}$ of a piezoelectric device, the smaller the power consumption of the device. Accordingly, it is possible to make piezoelectric device 1 a high performance and a high efficient piezoelectric device.

Hereinafter, an example of material design for piezoelectric body 13 that satisfies Formulae (1) and (2) above will be described. It is reported that, in bulk ceramics of a lead based perovskite oxide having a MPB composition, there is a correlation between the piezoelectric performance and the difference $|M_A - M_B|$ between average atomic weight of A-site elements $M_A$ and average atomic weight of B-site elements $M_B$, and the greater the $|M_A - M_B|$, the higher the electromechanical coupling coefficient $k_{33}$ (Y. Hosono and Y. Yamashita, "High-Efficiency Piezoelectric Single Crystals", Toshiba Review, Vol. 59, No. 10, pp. 39-42, 2004).

In the mean time, the value of $s_{33}$ is an inverse number of Young's modulus and it is, therefore, possible to improve the performance to a certain extent by selecting a material having a comparatively low Young's modulus, but the value range is fixed in a way by usable materials. Therefore, in order to increase the value of $d_{33}$ without increasing the relative permittivity, it is preferable to increase the value of $k_{33}$.

The present inventors have found that there is a correlation identical to that described above also in non-lead based perovskite oxides and have come up with an idea that a better piezoelectric performance might be obtained by selecting A-site elements and B-site elements such that $|M_A - M_B|$ becomes large. As a result, the present inventors have reported, in International Patent Publication No. WO2008/088086, that a high value of electromechanical coupling coefficient $k_{33}$ and excellent piezoelectric performance are achieved in non-lead perovskite oxide by designing the composition to become morphotropic phase boundary (MPB) or near MPB in a Si-based (atomic weight of 209.0) 33 system perovskite oxide. The term "near MPB" as used herein refers to a range in which a phase transition occurs when an electric field is applied.

Where piezoelectric body 13 is formed of one or more types of perovskite oxides, which may include an unavoidable impurity, the value of the electromechanical coupling coefficient $k_{33}$ may be increased by selecting A-site elements and B-site elements in MPB composition such that $|M_A - M_B|$ becomes large, as in International Patent Publication No. WO2008/088086.

Piezoelectric body 13 may be lead based or non-lead based, but is preferable to be non-lead based from the viewpoint of environmental burden. A material design for piezoelectric body 13 to satisfy Formulae (1) and (2) in non-lead system conducted by the present inventors using a method identical to that described in International Patent Publication No. WO2008/088086 has revealed that one or more types of perovskite oxides represented by General Formula (P) below are suitable. The present inventors also have found that it is preferable that, in General Formula (P) of a perovskite oxide, when the A-site element A is Ba and/or Bi, the B-site element M is an element other than Ti and Fe, while when the B-site element M is Ti and/or Fe, the A-site element A is an element other than Ba and Bi and the one or more types of perovskite oxides satisfy Formulae (5) and (6) below, and more preferably satisfy Formula (7).

$$(Ba,Bi,A)(Ti,Fe,M)O_3 \quad (P)$$

(In the formula, Ba, Bi, and A are A-site elements, and Ti, Fe, and M are B-site elements, in which A and M are one or more types of metal elements other than Pb respectively.)

Although the ratio of total molar amount of A-site elements or of the total molar amount of B-site elements to the molar amount of oxygen atoms is normally 1:3, the ratio may deviate from 1:3 within a range in which a perovskite structure can be obtained.

$$0.97 \leq TF(P) \leq 1.02 \quad (5)$$

$$TF(BiFeO_3) < TF(AMO_3) < TF(BaTiO_3) \quad (6)$$

$$0.97 \leq TF(AMO_3) \leq 1.02 \quad (7)$$

(In formulae above, TF(P) is a tolerance factor of an oxide represented by General Formula (P) above, $TF(BiFeO_3)$, $TF(AMO_3)$, and $TF(BaTiO_3)$ are tolerance factors of the oxides in parentheses respectively.

In the material design described above, the present inventors theoretically obtained tolerance factors of $BaTiO_3$, $BiFeO_3$, $AMO_3$, and a perovskite oxide represented by General Formula (P) above ($TF(BaTiO_3)$=1.059, $TF(BiFeO_3)$= 0.989). In this case, the tolerance factor of an oxide which can not take a perovskite structure is also obtained theoretically. Then, the composition of General Formula (P) is determined so as to satisfy the specified relationship.

Figure 2:
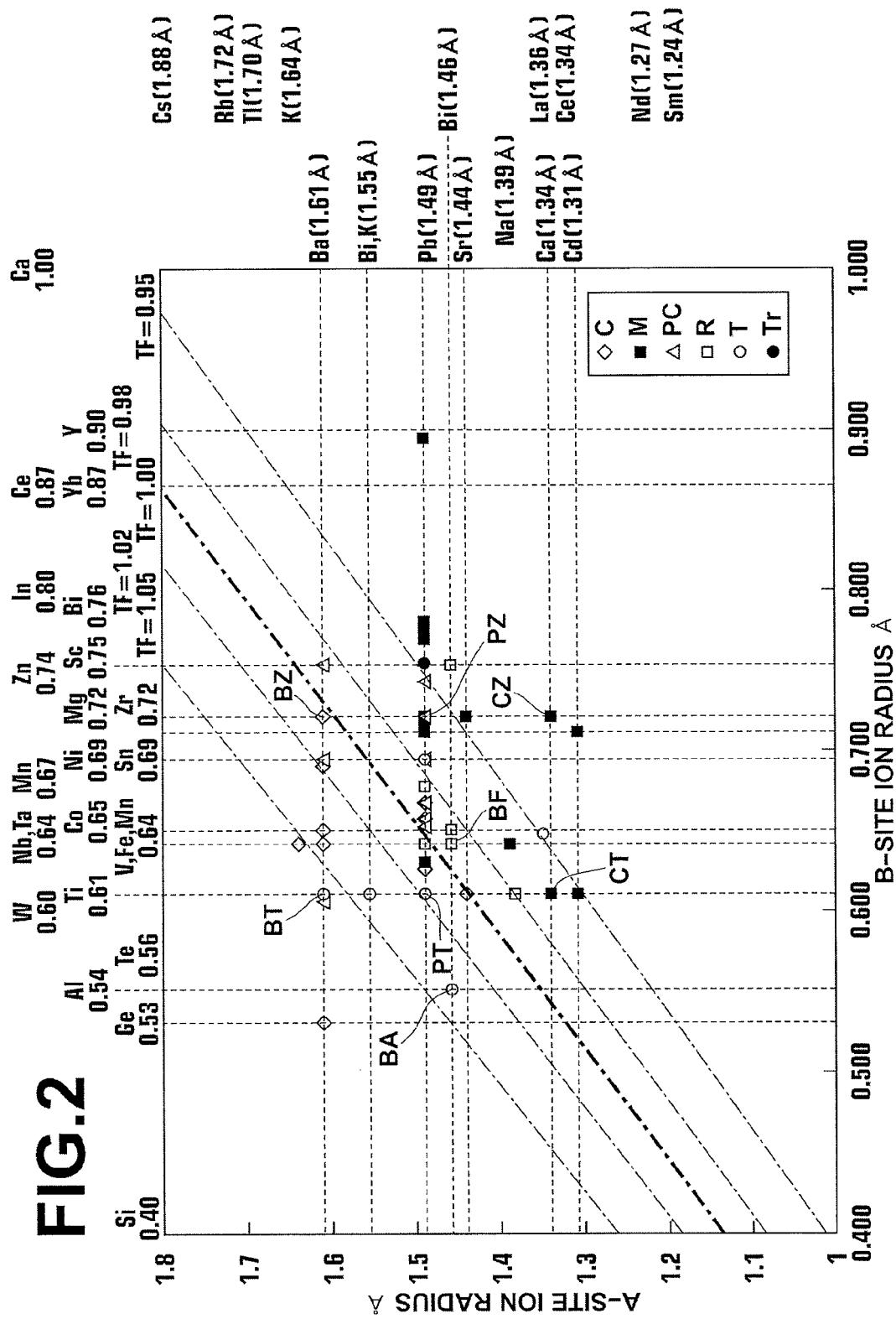
FIG. 2 illustrates the relationship among ion radii of A-site elements, ion radii of B-site elements, tolerance factors, and crystal systems with respect to various perovskite oxides.

FIG. 2 illustrates the relationship among the average ion radius of A-site elements, average ion radius of B-site elements, tolerance factor TF, and crystal system with respect to each of various perovskite oxides in which A-site includes one or more elements and B-site includes one or more elements. In the drawing, the following symbols represent the following crystal systems: C=cubic crystal; M=monoclinic crystal; PC=pseudocubic crystal; R=rhombohedral crystal; T=tetragonal crystal; and Tr=trigonal crystal. Two types of Mn are shown in FIG. 2 in which 0.64 Å indicates the ion radius of trivalent Mn and 0.67 Å indicates the ion radius of bivalence Mn.

The perovskite crystal lattice becomes close packed when TF=1.0. Under this condition, the B-site elements do not substantially move in the crystal lattice and are likely to take a stable structure. With this composition, the peroviskite type oxide is likely to take a crystal structure, such as cubic crystal or pseudocubic crystal, and does not show ferroelectricity or may show ferroelectricity with an extremely low level.

The B-site element is small with respect to the A-site element when TF>1.0. Under this condition, the B-site elements are likely to enter into the crystal lattice even when the crystal lattice is not distorted and movable within the crystal lattice. With this composition, the peroviskite type oxide is likely to take a crystal structure, such as tetragonal crystal (with spontaneous polarization axis in <001> direction) or the like, and has ferroelectricity. The level of the ferroelectricity tends to be increased as the TF value deviates from 1.0.

The B-site element is large with respect to the A-site element when TF<1.0. Under this condition, the B-site elements do not enter the crystal lattice unless the crystal lattice is distorted. With this composition, the peroviskite type oxide is likely to take a crystal structure, such as orthorhombic crystal (with spontaneous polarization axis in <110> direction) or rhombohedral crystal (with spontaneous polarization axis in <111> direction), and has ferroelectricity. The level of the ferroelectricity tends to be increased as the TF value deviates from 1.0. Table 1 summarizes, with respect to each of various mixed crystals of first components with TF>1.0 and second components with TF<1.0, crystal system/A-site ion radius/B-site ion radius/TF/ratio (molar ratio) between the first and second components that forms morphotropic phase boundary (MPB) composition of each separate component, and A-site average ion radius/B-site average ion radius/TF of each of mixed crystals of first and second components having MPB compositions. In Table 1, the following symbols represent the following crystal systems: T=tetragonal crystal; O=orthorhombic crystal; and R=rhombohedral crystal.

As shown in Table 1, the TE's of MPB compositions fall within a range from 0.97 to 1.02. Thus, piezoelectric body 13 may have a composition of MPB or near MPB by providing a composition that satisfies, $$0.97 \leq TF(P) \leq 1.02 \quad (5)$$

The perovskite oxide described above may have a three phase mixed crystal structure in which the three components $BaTiO_3$, $BiFeO_3$, and $AMO_3$ coexist, or a single-phase structure in which the three components $BaTiO_3$, $BiFeO_3$, and $AMO_3$ are completely solid solved into a single phase. Further, the perovskite oxide may have another structure.

Preferably, however, a perovskite oxide represented by General Formula (P) includes a first component, $BaTiO_3$, with TF>1.0, a second component, $BiFeO_3$, with TF<1.0, and a third component, $AMO_3$, with TF near 1.0 (in each component, the ratio of total molar amount of A-site elements or of the total molar amount of B-site elements to the molar amount of oxygen atoms is normally 1:3, but the ratio may deviate from 1:3 within a range in which a perovskite structure can be obtained).

Further, it is particularly preferable that the first component, $BaTiO_3$, second component, $BiFeO_3$, and third compo-

TABLE 1

| | | TF > 1 | | | | | TF < 1 | | | | | MPB | | |
|---|---|---|---|---|---|---|---|---|---|---|---|---|---|---|
| | | Crystal System | A-site Ion Radius | B-site Ion Radius | TF | Ratio | | Crystal System | A-site Ion Radius | B-site Ion Radius | TF | Ratio | A-site Ion Radius | B-site Ion Radius | TF |
| PT-PZ | $PbTiO_3$ | T | 1.49 | 0.605 | 1.019 | 0.48 | $PbZrO_3$ | R | 1.49 | 0.72 | 0.964 | 0.52 | 1.49 | 0.66 | 0.990 |
| PT-PS | $PbTiO_3$ | T | 1.49 | 0.605 | 1.019 | 0.45 | $PbSnO_3$ | R | 1.49 | 0.69 | 0.978 | 0.55 | 1.49 | 0.65 | 0.996 |
| PT-BiS | $PbTiO_3$ | T | 1.49 | 0.605 | 1.019 | 0.65 | $BiScO_3$ | R | 1.46 | 0.745 | 0.943 | 0.35 | 1.48 | 0.65 | 0.991 |
| BT-BiNT | BT | T | 1.61 | 0.605 | 1.062 | 0.15 | $(Bi,Na)TiO_3$ | R | 1.425 | 0.605 | 0.996 | 0.85 | 1.45 | 0.61 | 1.006 |
| BT-BiNT | BT | T | 1.61 | 0.605 | 1.062 | 0.07 | $(Bi,Na)TiO_3$ | R | 1.425 | 0.605 | 0.996 | 0.93 | 1.44 | 0.61 | 1.001 |
| BT-BiNT | $(Bi,K)TiO_3$ | T | 1.55 | 0.605 | 1.041 | 0.20 | $(Bi,Na)TiO_3$ | R | 1.425 | 0.605 | 0.996 | 0.80 | 1.45 | 0.61 | 1.005 |
| KN-NN | $KNbO_3$ | O | 1.64 | 0.64 | 1.054 | 0.49 | $NaNbO_3$ | O | 1.39 | 0.64 | 0.967 | 0.51 | 1.51 | 0.64 | 1.010 |

A perovskite oxide represented by General Formula (P) includes a first component, $BaTiO_3$, with TF>1.0 (TF=1.059) and second component, $BiFeO_3$, with TF<1.0 (TF=0.989), and may form a MPB. Accordingly, a perovskite oxide that satisfies Formulae (5) and (6), preferably Formulae (5) to (7), may be designed by selecting additive elements A and M such that an overall TF falls within the range from 0.97 to 1.02 in General Formula (P).

More specifically, A-site elements may include La, Ca, Sb, Bi, Si, Sr, and the like, and also Pb in which case the perovskite oxide is not a non-lead system though. B-site elements may include Nd, Nb, Ta, Cr, Fe, Sc, and the like.

For example, when $SrTiO_3$ is selected as a third component, the TF of $SrTiO_3$ is 1.002 which is nearly 1.0 (within the range from 0.97 to 1.01), so that addition of $SrTiO_3$ to $BaTiO_3$ and $BiFeO_3$ may cause the overall TF to fall within the range from 0.97 to 1.01. Here, the composition is (Ba, Bi, Sr) (Ti, Fe) $O_3$.

When A or M in $AMO_3$ of Formula (5) above includes a plurality of elements, the mixed quantity of each element may be determined arbitrarily within a range in which Formula (5) is satisfied. In this case, a portion of A and M may function as a dopant.

It is known that electrical property is improved by adding a dopant to A-site and B-site. Preferable elements as the dopant include metal ions, such as Mg, Ca, Sr, Ba, Bi, Nb, Ta, W, Mn, and Ln (lanthanide elements (La, Ce, Pr, Nd, Sm, Eu, Gd, Tb, Dy, Ho, Er, Tm, Yb, and Lu)).

$BiFeO_3$ is known as a material having a high Curie temperature. Accordingly, as the $BiFeO_3$ component is increased in General Formula (P), so is the Curie temperature of piezoelectric body 13. Therefore, the usability under a high temperature environment is also increased.

nent, $AMO_3$, have different crystal systems. An example may be a form in which the crystal system of the first component, $BaTiO_3$, is tetragonal crystal, the crystal system of the second component, $BiFeO_3$, is rhombohedral crystal, and the crystal system of the third component, $AMO_3$, is cubic crystal or pseudocubic crystal. The perovskite oxide having the three phase mixed crystal structure of the first to third components described above ($BaTiO_3$, $BiFeO_3$, and $AMO_3$) is an effective material for electric field induced phase transition systems proposed by the present inventors in U.S. Patent Application Publication No. 20090267998, in which the present inventors have found that a high piezoelectric performance can be obtained.

Piezoelectric device 1 of the present embodiment may become a piezoelectric device that satisfies Formulae (3) and (4) below and has a high piezoelectric strain constant and a high voltage output constant by designing the material of piezoelectric body 13 in the manner as described above.

$$100 < d_{33}(pm/V) \quad (3)$$

$$80 < g_{33}(\times 10^{-3} V \cdot m/N) \quad (4)$$

($g_{33}$ is the voltage output constant (piezoelectric sensitivity constant) of the piezoelectric body described above).

As shown in FIG. 10, Examples of piezoelectric device 1 achieve a $d_{33}$ value of about 200 pm/V. The $d_{33}$ value described above is the world's highest value reported by the time of the filing of the present application in non-lead systems. Piezoelectric device 1 having a composition of MPB or near MPB, a high electromechanical coupling coefficient, and a high piezoelectric performance may be obtained by forming piezoelectric body 13 with the perovskite oxide designed based on the material design described above.

So far, particularly preferable non-lead based materials for piezoelectric body 13 have been described, but the materials for piezoelectric body 13 are not limited to those described above and any other material, regardless of whether it is a lead based or non-lead based material, may be applied to the method of designing perovskite oxide compositions. It is preferable that the material has a MPB composition as more favorable piezoelectric property can be obtained, but piezoelectric body 13 having a composition other than a MPB composition may be formed by favorably increasing the electromechanical coupling coefficient $k_{33}$. Further, by favorably combining the piezoelectric strains (1) to (4) described above, the piezoelectric performance may further be enhanced.

[Inkjet Recorder]

Figure 3:
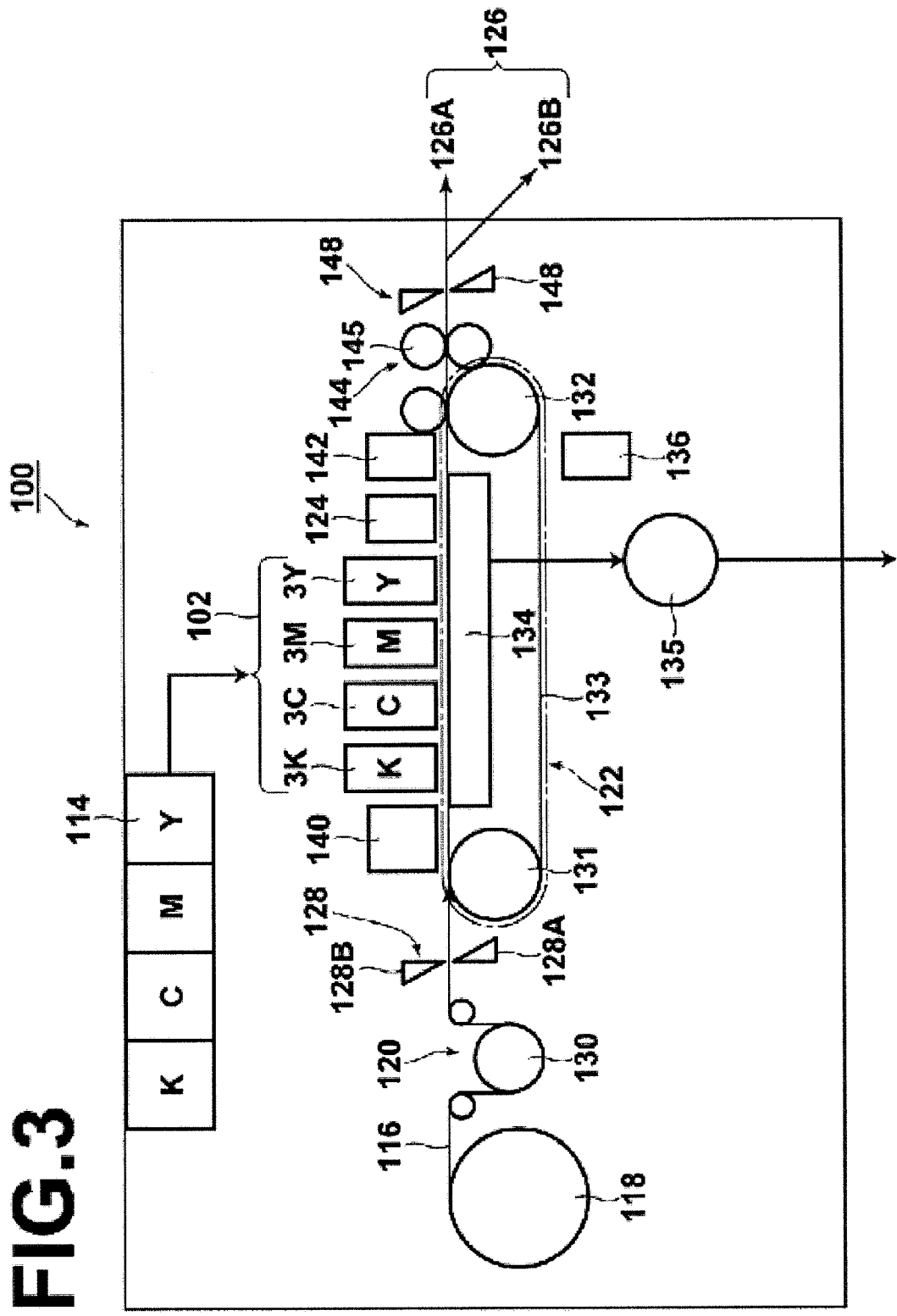
FIG. 3 illustrates an example configuration of an inkjet recorder having the inkjet recording head shown in FIG. 1.
Figure 4:
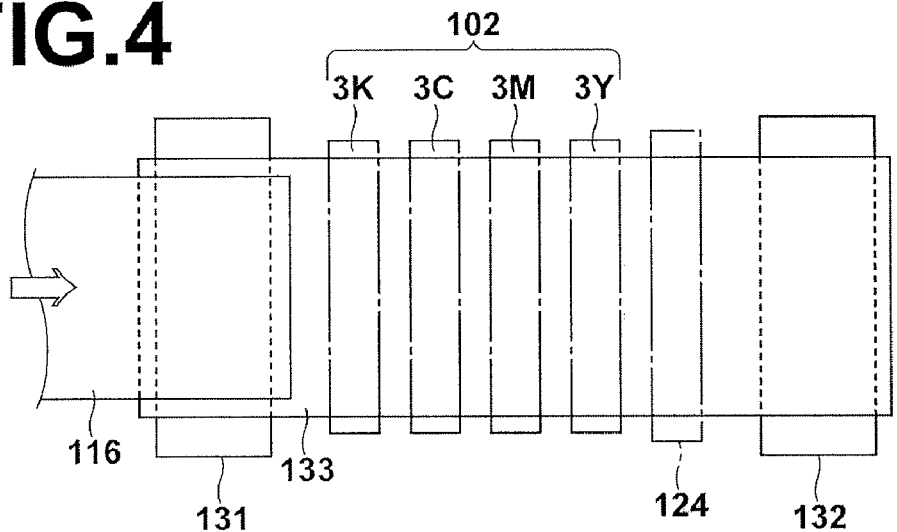
FIG. 4 is a partial top view of the inkjet recorder shown in FIG. 3.

An example configuration of an inkjet recorder having an inkjet recording head 3 according to the embodiment described above will be described with reference to FIGS. 3 and 4. FIG. 3 is an overall view and FIG. 4 is a partial top view of the recorder.

Illustrated inkjet recorder 100 basically includes print section 102 having a plurality of inkjet recording heads (hereinafter, simply "heads" or "head") 3K, 3C, 3M, and 3Y, each for each ink color, ink storage/mount section 114 for storing inks to be supplied to each of heads 3K, 3C, 3M, and 3Y, paper feed section 118 for feeding recording paper 116, decurling section 120 for decurling recording paper 116, suction belt conveyor 122, disposed opposite to the nozzle surface (discharge surface) of print section 102, for conveying recording paper 116 while maintaining flatness of recording paper 116, print detection section 124 for reading a result of printing performed by print section 102, and paper discharge section 126 for discharging a printed paper (printed material) to the outside.

Each of Heads 3K, 3C, 3M, and 3Y constituting print section 102 corresponds to inkjet recording head 3 according to the embodiment described above.

In decurling section 120, recording paper 116 is decurled by heating with heating drum 130 in the direction opposite to the curled direction of recording paper 116 wound on a roll. For a recorder that uses a roll paper, cutter 128 for cutting the roll paper is provided at a latter stage of decurling section 120, as illustrated in FIG. 3, and the roll paper is cut out to a desired size. Cutter 128 includes fixed blade 128A having a length greater than the width of the conveyor path and round blade 128B that moves along fixed blade 128A, in which fixed blade 128A is provided on the rear side of the printing surface and round blade 128B is provided on the printing surface side across the conveyor path. A recorder that uses a cut sheet does not require cutter 128.

Decurled and cutout recording paper 116 is fed to suction belt conveyor 122. Suction belt conveyor 122 includes rollers 131, 132, and endless belt 133 wound between them, and configured such that at least the portion opposite to the nozzle surface of print section 102 and the sensor surface of print detection section 124 becomes a level plane (flat plane).

Belt 133 has a width greater than that of recording paper 116 and many suction holes (not shown) are formed in the belt face. Suction chamber 134 is provided at the position opposite to the nozzle surface of print section 102 and the sensor surface of print detection section 124 in the inner side of belt 133 wound between rollers 131, 132. Suction chamber 134 is suctioned by fan 135 so as to have a negative pressure, thereby suction-holding recording paper 116 on belt 133.

Power is supplied to at least either one of rollers 131, 132 from a motor (not shown), whereby belt 133 is driven in clockwise direction in FIG. 3 and recording paper 116 held on belt 133 is conveyed from left to right in FIG. 3.

When a borderless print or the like is printed, the ink adheres also to belt 133, so that belt cleaning section 136 is provided at a predetermined position (appropriate position other than the printing area) on the outer side of belt 133. Heating fan 140 is provided on the upstream side of print section 102 on the paper conveyer path formed by suction belt conveyor 122. Heating fan 140 blows heated air onto recording paper 116 before printing to heat recording paper 116. By heating recording paper 116 immediately preceding the printing, spotted inks on recording paper 116 are dried faster.

Print section 102 is a so-called full line head in which line heads having a length corresponding to a maximum paper width are disposed in a direction (main scanning direction) orthogonal to the paper feed direction (FIG. 4). Each of printing heads 3K, 3C, 3M, and 3Y is a line head having a plurality of ink discharge openings (nozzles) disposed over a length which exceeds at least one side of maximum size of recording paper 116.

Heads 3K, 3C, 3M, and 3Y corresponding to black (K), cyan (C), magenta (M), and yellow (Y) are disposed in this order from the upstream side along the paper feed direction of recording paper 116. A color image is recorded on recording paper 116 while being conveyed by discharging a color ink from each of heads 3K, 3C, 3M, and 3Y.

Print detection section 124 is constituted by a line sensor or the like for imaging inkjet results of print section 102 to detect an inkjet fault, such as clogging of a nozzle, from the obtained inkjet image. Post drying section 142 constituted by a heating fan or the like for drying the printed image surface is provided at the latter stage of print detection section 124. It is desirable that the printed surface avoids any contact until the inks are dried, so that a method of blowing heated air is preferable.

Heating/pressing section 144 for controlling the glossiness of an image surface is provided at the latter stage of post drying section 142. In heating/pressing section 144, the image surface is pressed, while being heated, by pressing rollers 145 having a predetermined uneven surface shape to transfer the uneven shape to the image surface.

The printed material obtained in the manner described above is discharged from paper discharge section 126. Preferably, an intended print (print on which an intended image is printed) and a test print are discharged separately. Inkjet recorder 100 includes a selection means (not shown) for selecting and switching paper discharge paths between intended prints and test prints to send them discharge section 126A and 126B respectively. Where an intended image and a test image are printed on a large paper in parallel at the same time, cutter 148 may be provided to separate the test print portion. Inkjet recorder 100 is structured in the manner as described above.

[Power Generating Apparatus]

Figure 5:
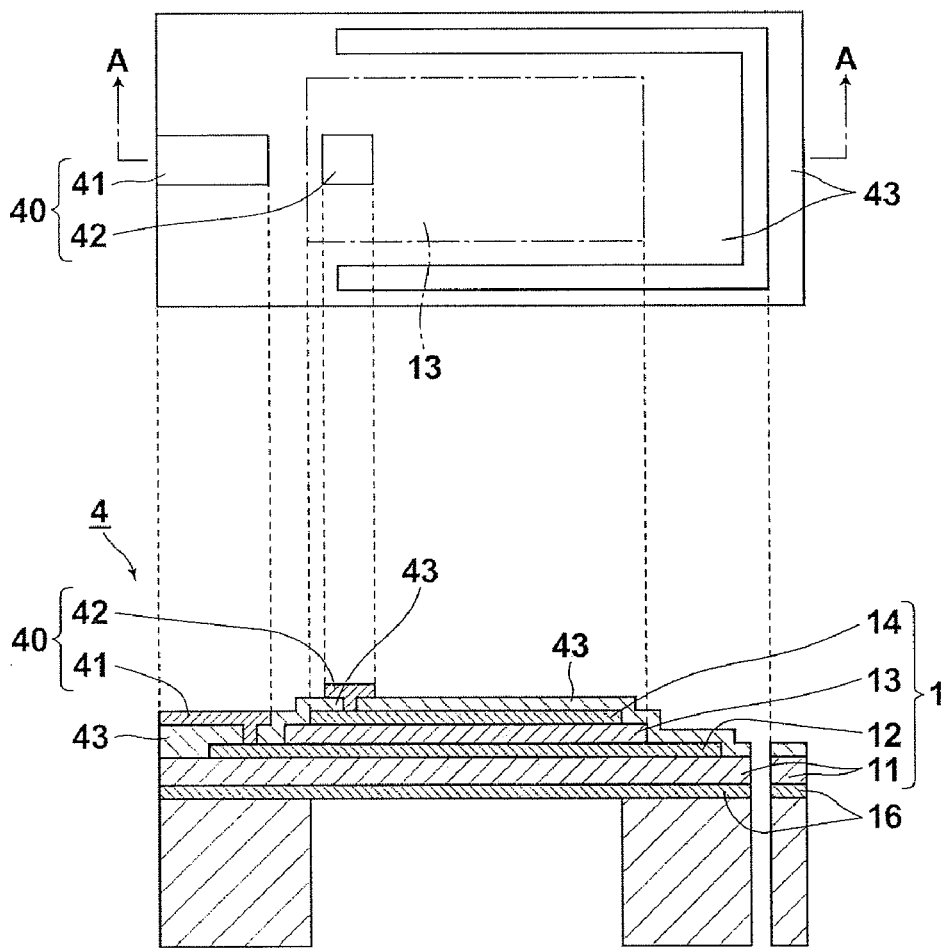
FIG. 5 illustrates a relevant part of a power generating apparatus according to an embodiment of the present invention.

A piezoelectric device according to an embodiment of the present invention and a configuration of a power generating apparatus having the piezoelectric device will be described. FIG. 5 illustrates a relevant part of the power generating apparatus according to the present embodiment. Each of the components is not necessarily drawn to scale for facilitating visibility.

Power generating apparatus 4 shown in FIG. 5 includes piezoelectric device 1, a vibration plate 16, on the rear surface of piezoelectric device 1, for conveying an external force to piezoelectric body 13 to displace the body, and extraction electrode 40 (41, 42) for extracting charges generated in piezoelectric body 13 by the displacement to outside from the electrodes (lower electrode 12 and upper electrode 14). In the present embodiment, piezoelectric device 1 is supported in a cantilever fashion (FIG. 5), and the supported end is connected to a generation source (not shown) that generates the external force. The surface (upper surface) of power generating apparatus 4 is covered with an insulating protection film 43, such as $SiO_2$, and the like, other than the surface of extraction electrode 40. The cantilever fashion is preferable because it allows piezoelectric body 13 to be displaced largely when an external force is applied.

When piezoelectric body 13 is displaced by an external force, a tensile stress and a compressive stress are generated in piezoelectric device 1. As piezoelectric body 13 is firmly fixed to vibration plate 16, the fixed surface can not expand or contract and, thereby, the stresses described above are applied, whereby charges are generated on the lower electrode 12 and upper electrode 14.

There is not any specific restriction on the material of vibration plate 16 as long as it has favorable elasticity and various materials, including resins, metals, ceramics, and the like, may be used, and those having favorable corrosion resistance and elasticity, such as stainless steel and phosphor bronze, are particularly preferable.

There is not any specific restriction on the material of extraction electrode 40, and a metal electrode having favorable conductivity, such as Au and the like, is preferably used.

When, for example, a SOI substrate is used as substrate 11, power generating apparatus 4 may be manufactured in the following manner: forming lower electrode 12, piezoelectric body 13, and upper electrode 14, one after another, on substrate 11; forming cantilever form having vibration plate 16 by etching a portion of substrate 11 from the rear side, as in inkjet recording head 3; forming protection film 43 and extraction electrode 40; and finally performing dry etching.

Piezoelectric device 1 has an identical structure to that of piezoelectric device 1 of the inkjet recording head described above. In actuator applications, d-constant is the index of the performance, while in power generating apparatus applications, d×g serves as the index of the power generation efficiency as described under the "Description of the Related Art", so that piezoelectric device needs to have a high g-constant, as well as a high d-constant.

In the embodiment of inkjet recording head 3 above, the description has been made only for d-constant but, as described above, piezoelectric device 1 of the embodiment includes piezoelectric body 13 having a low permittivity value and a high electromechanical coupling coefficient $k_{33}$. Consequently, piezoelectric device 1 described in the aforementioned embodiment is a device having both a high d-constant and a high g-constant.

In Examples, to be described later, for example, high $d_{33}$ values and high $g_{33}$ values are achieved at low permittivity values, as shown in FIGS. 10 and 11 ($d_{33} \geq 200$ pm/V, $g_{33} \geq 120 \times 10^{-3}$ V·m/N). As already described, the product of d-constant and g-constant ($d_{33} \times g_{33}$) of a piezoelectric material serves as the index of the power generation efficiency. Since high products of $d_{33} \times g_{33}$, that is $d_{33} \times g_{33} \geq 24$ ($\times 10^{-12}$ $m^2$/N), are obtained in Examples, according to the present embodiment, a power generating apparatus having a high $d_{33} \times g_{33}$ value and excellent power generation efficiency may be obtained.

Piezoelectric device 1 includes piezoelectric body 13 having a piezoelectric strain constant $d_{33}$ (pm/V) and a relative permittivity $\epsilon_{33}$ that satisfy Formulae (1) and (2) below.

$$100 < \epsilon_{33} < 1500 \tag{1}$$

$$d_{33}(pm/V) > 12\sqrt{\epsilon_{33}} \tag{2}$$

It has been thought to be difficult to obtain both a high $d_{33}$ value and a high $g_{33}$ value, and the present embodiment has succeeded, for the first time, in obtaining a high $d_{33}$ value without increasing the permittivity. Piezoelectric device 1 includes a piezoelectric body having a high $d_{33}$ value at low permittivity, that is, piezoelectric device 1 includes piezoelectric body 13 having both a superior $d_{33}$ value and a voltage output constant $g_{33}$ value, so that piezoelectric device 1 is excellent in both transmission and reception capabilities. Therefore, piezoelectric device 1 is appropriate for a piezoelectric actuator and a power generating device.

The power consumption of a piezoelectric device is decreased as the permittivity is decreased and as the piezoelectric constant is increased. Accordingly, piezoelectric device 1 is a high performance and high efficient piezoelectric device.

Further, piezoelectric device 1 may include piezoelectric body 13 formed of a Pb-free perovskite oxide. It is considered to be preferable to avoid the use of Pb in electrical and electronic devices as much as possible due to its harmful effects. Therefore, also from the viewpoint of reduction of environmental burden, the configuration of piezoelectric device 1 is preferable.

[Design Change]

In the aforementioned embodiments, the discretion has been made of a case in which piezoelectric body 13 is a piezoelectric film formed on a substrate, but piezoelectric body 13 may be a bulk body. When piezoelectric body 13 is a bulk body, the body is preferable to be a single crystal or a particle oriented ceramics sintered body. The particle oriented ceramics sintered body may be formed by hot pressing method, sheet method, or laminating press method that press laminates a plurality of sheets obtained by sheet method.

In the embodiments above, the description has been made of a case in which piezoelectric device 1 is used for an actuator of an inkjet recording head and power generating apparatus, but the piezoelectric device 1 is not limited to those applications. Since piezoelectric device 1 is favorable in both reception and transmission capabilities, the device may be used in applications requiring either property. That is, piezoelectric device 1 may provide a high performance in a case where either of the reception capability and transmission capability of piezoelectric device is required, such as in sensor and ultrasonic sensor applications, and the like.

Further, a preferable form of a piezoelectric device, such as the thickness or the like, differs from application to application. For ultrasonic sensor applications, for example, it is preferable that the piezoelectric film has a thickness of about 10 to 100 μm.

Therefore, it is preferable that the size and film thickness of the piezoelectric device of the present invention are designed appropriately according to the application.

EXAMPLES

Examples of the present invention and Comparative Examples will now be described.

Example 1

A (100) $SrTiO_3$ (STO) substrate having a thickness of 500 μm was provided and a $SrRuO_3$ (SRO) lower electrode layer was formed on a surface of the substrate by a pulse laser deposition method (PLD method) with a thickness of 200 nm. When forming the lower electrode, a commercially available SRO target was used as the target under the following film forming conditions: substrate temperature of 700° C.; oxygen partial pressure of 10 mTorr (1.3 Pa), laser power of 300 mJ;

laser pulse frequency of 5 Hz; distance between the substrate and target of 50 mm; target rotation speed of 9.7 rpm; and film forming time of 10 minutes.

Then, two types of (Ba, Bi) (Ti, Fe, Mn) $O_3$ films having different compositions were formed on the SRO lower electrode with a substrate temperature of 580° C. and oxygen partial pressure of 50 mTorr. The two compositions were $(Ba_{0.2}, Bi_{0.8})(Ti_{0.19}, Fe_{0.76}, Mn_{0.05}) O_3$ (film (1)) and $(Ba_{0.3}, Bi_{0.7})(Ti_{0.29}, Fe_{0.66}/Mn_{0.05}) O_3$ (film (2)), and targets that can provide the respective compositions were prepared and film forming was performed. The targets used for the film forming were prepared in the following manner.

First, commercially available $BaTiO_3$, $BiFeO_3$, and $Mn_2O_3$ powders were provided and weighed so that desired compositions were obtained. Then weighed powders for each desired composition were stirred to combine using a ball mill and a mortar. For the $BiFeO_3$ powder, a powder that includes Bi in excess of 10% in order to compensate for a vaporized amount of Bi which is more likely to be vaporized under a high vapor pressure.

Figure 6:
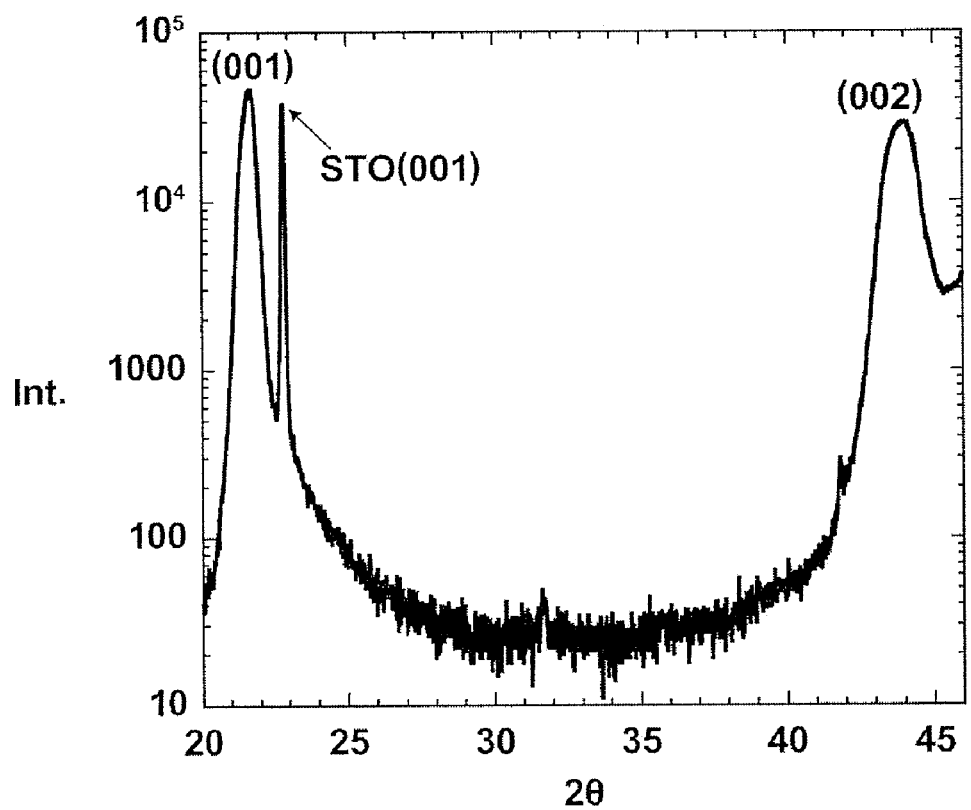
FIG. 6 illustrates XRD results of a piezoelectric body of Example 1.
Figure 7:
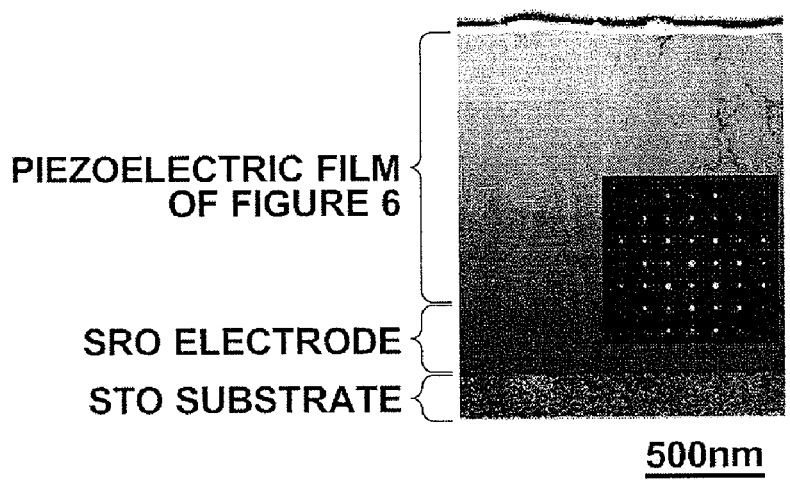
FIG. 7 illustrates TEM image and electron diffraction results of the piezoelectric body of Example 1.

A crystal structure analysis was performed on the obtained piezoelectric film by XRD and electron diffraction, the results of which are shown in FIGS. 6 and 7 respectively. FIG. 7 shows a TEM image of the piezoelectric device with the electron diffraction analysis result, and only a [100] incident diffraction pattern is observed. Thus, from FIGS. 6 and 7, the piezoelectric film was confirmed to be a (001) epitaxial film having a uniform crystal orientation. Note that FIGS. 6 and 7 shows measurement results of film (2) having a composition with a Ba component of 0.3. Although identical results were obtained with film (1) but omitted here.

A composition analysis was performed on the piezoelectric film (1) with the obtained target composition of $(Ba_{0.2}, Bi_{0.8})(Ti_{0.19}, Fe_{0.76}, Mn_{0.05}) O_3$ by inductively coupled plasma (ICP), and the result confirmed was $(Ba_{0.22}, Bi_{0.78})(Ti_{0.17}, Fe_{0.79}, Mn_{0.04}) O_3$ which differs from the composition of the target only by 5% or less.

Next, in order to evaluate the properties of the piezoelectric film, Pt upper electrodes of 10 μm and 100 μm diameters with a thickness of 100 nm were formed by a sputtering method, whereby a piezoelectric device of the present invention was produced. In order to measure the permittivity $\epsilon_{33}$ and piezoelectric constant $d_{33}$ for evaluation, upper electrodes were formed at two positions.

The measurement of permittivity $\epsilon_{33}$ of the piezoelectric device obtained was performed using an impedance analyzer (TOYO Corporation) at the 100 μm electrode, and the measurement of piezoelectric constant $d_{33}$ was performed by AFM after side etching the piezoelectric film having the 10 μm electrode.

The measurement of $d_{33}$ by AFM was performed in the following manner. While bringing a probe of AFM into contact with a surface of the upper electrode, an expansion of the film at the time of voltage application was obtained from the displacement of the probe in an up/down direction. The measuring frequency was 1 kHz. In this method, side etching was performed in order to improve measurement accuracy.

Measurement errors and high accuracy measurement through side etching in piezoelectric performance measurement by AFM is described in a literature "Electric-Field-Induced displacements in Pt/PZT/Pt/SiO2/Si System Investigated by Finite Element Method: Material-Constant Dependences" by H. Okino et al., "Electric-Field-Induced Displacements in Pt/PZT/Pt/SiO$_2$/Si System Investigated by Finite Element Method: Material-Constant Dependences", Mater. Res. Soc. Symp. Proc., Vol. 902E, T03-49.1-T03-49.6, 2006.

Figure 8:
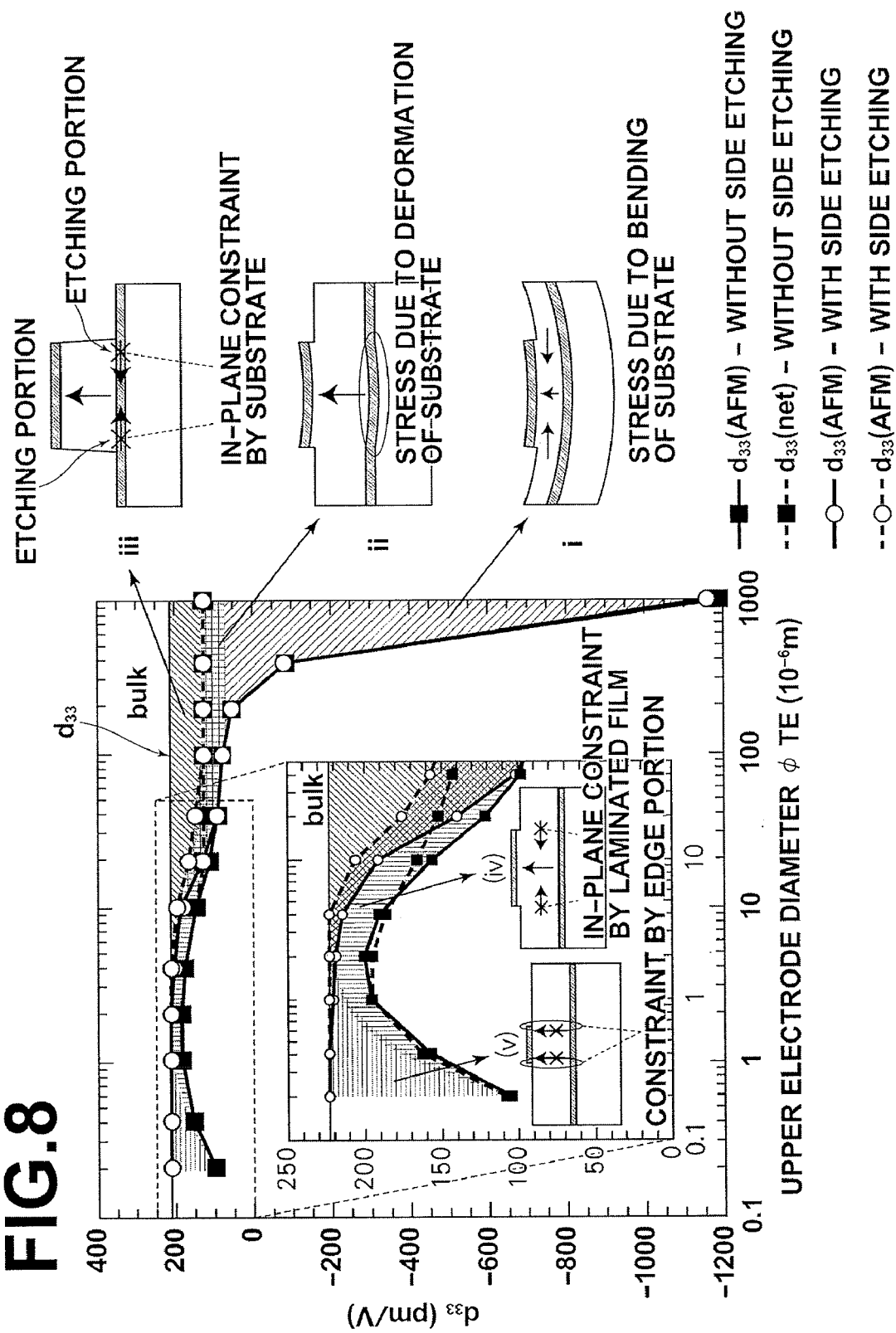
FIG. 8 illustrates side etching effects for piezoelectric property errors by AFM (FIG. 1 of Non-patent Document 3).

The literature discusses the accuracy of values obtained by AFM from piezoelectric devices having the following stacked in the order of substrate/lower electrode/piezoelectric film/upper electrode (dotted) depending on the shape of the film (with or without side etching) and the size of the upper electrode (after all, upper electrode size/film thickness). As shown in FIG. 1 of the literature described above (FIG. 8 of this specification), a piezoelectric performance smaller than an inherent performance is detected due to the constraint that the piezoelectric film is tied down to the substrate and the other laminated film, but performance of side etching on the tied-down portions (indicated by X marks and designated as "etching portion" in the drawing) may release the piezoelectric film from the constraint and inherent performance of the piezoelectric film may be measured.

The permittivity and piezoelectric properties ($d_{33}$ values and $g_{33}$ values) were measured for two types of piezoelectric devices having different compositions. Measurement results for film (1) with the composition of $(Ba_{0.2}, Bi_{0.8})(Ti_{0.19}, Fe_{0.76}/Mn_{0.05}) O_3$ were: $\epsilon_{33}=115$, $d_{33}=183$ pm/V, and $g_{33}=180\times10^{-3}$ V·m/N.

Measurement results for film (2) with the composition of $(Ba_{0.3}, Bi_{0.7})(Ti_{0.29}, Fe_{0.33}, Nn_{0.05}) O_3$ were: $\epsilon_{33}=140$, $d_{33}=171$ pm/V, and $g_{33}=138\times10^{-3}$ V·m/N.

Example 2

A (100) Si substrate with a thickness of 500 μm was provided, and a MgO buffer layer with a thickness of about 20 nm and a $SrRuO_3$ (SRO) lower electrode layer with a thickness of about 200 nm were formed on a surface of the substrate by a pulse laser deposition method (PLD method) after removing a natural oxide film from the surface of the substrate. When forming the layers, commercially available Mg metal target and SRO target were used as the targets under the following film forming conditions: substrate temperatures of 400° C. (MgO) and 700° C. (SRO); oxygen partial pressures of 1 mTorr (0.13 Pa) and 10 mTorr (1.3 Pa), laser power of 300 mJ; laser pulse frequency of 5 Hz; distance between the substrate and target of 50 mm; target rotation speed of 9.7 rpm; and film forming times of 2 minutes (MgO) and 10 minutes (SRO).

Then, two types of (Ba, Si) (Ti, Fe, Mn) $O_3$ films having different compositions were formed on the SRO lower electrode (film (1)' and film (2)') by a PLD method with a thickness of 120 nm in the same manner as Example 1.

A crystal structure analysis performed on the obtained piezoelectric film showed that the film was a (001) epitaxial film (FIG. 9).

In Example 2, a composition analysis by ICP was omitted, since it was confirmed that substantially no composition change had occurred in Example 1.

Next, a piezoelectric device of the present invention was produced and the permittivity and piezoelectric property ($d_{33}$ value and $g_{33}$ value) were measured in the same manner as in Example 1. Measurement results for film (1)' were: $\epsilon_{33}=250$, $d_{33}$=244 pm/V, and $g_{33}$=110×10$^{-3}$ V·m/N Measurement results for film (2)' were: $\epsilon_{33}$=300, $d_{33}$=220 pm/V, and $g_{33}$=83×10$^{-3}$ V·m/N

Example 3

Two films (film (3) and film (4)) having different compositions were formed using substrates and method identical to those of Example 1. The composition of film (3) was (Ba$_{0.15}$, Bi$_{0.8}$, Sr$_{0.05}$) (Ti$_{0.19}$, Fe$_{0.78}$, Mn$_{0.08}$) O$_3$ and composition of film (4) was (Ba$_{0.2}$, Bi$_{0.8}$) (Ti$_{0.15}$, Fe$_{0.75}$, Nb$_{0.05}$, Mn$_{0.05}$) O$_3$.

The targets were prepared by adding SrTiO$_3$ and BaNbO$_3$ to the existing targets respectively.

Example 4

Two films (film (3) and film (4)) having different compositions were formed using substrates and method identical to those of Example 2. The composition of film (3) was (Ba$_{0.15}$, Bi$_{0.8}$, Sr$_{0.05}$) (Ti$_{0.19}$, Fe$_{0.76}$/Mn$_{0.05}$) O$_3$ and composition of film (4) was (Ba$_{0.2}$, Bi$_{0.8}$) (Ti$_{0.15}$/Fe$_{0.78}$, Nb$_{0.05}$, Mn$_{0.08}$) O$_3$.

(Comparison Between Existing Values and Examples)

FIG. 10 shows the relationship between permittivity and piezoelectric strain constant of piezoelectric devices of examples described above and piezoelectric devices made of known lead based and non-lead based materials. As shown in FIG. 10, the relationship between the permittivity and piezoelectric strain constant of lead based and non-lead based materials is substantially in a proportional relationship, while the plots of examples described above deviate largely from the linear lines, showing high $d_{33}$ values in the low permittivity side. Therefore, it is confirmed that the piezoelectric devices of examples described above are novel piezoelectric devices having an unprecedented high electromechanical coupling coefficient $k_{33}$.

FIG. 11 plots the obtained $g_{33}$ values with respect to $d_{33}$ values. As shown in FIG. 11, it is confirmed that the piezoelectric devices of examples described above are piezoelectric devices having both a high transmission capability required for actuators and the like, and a high reception capability required for sensors and the like. Table 2 below summarizes data of each example.

What is claimed is:

1. A piezoelectric device, comprising a piezoelectric body having piezoelectricity and a pair of electrodes for applying an electric field to the piezoelectric body in a predetermined direction,
    wherein a piezoelectric strain constant $d_{33}$ (pm/V) and a relative permittivity $\epsilon_{33}$ of the piezoelectric body satisfy Formulae (1) and (2) below $$100<\epsilon_{33}<1500 \quad (1)$$

$$d_{33}(pm/V)>12\sqrt{\epsilon_{33}} \quad (2)$$

wherein the piezoelectric body is formed of one or more types of perovskite oxides represented by General Formula (P) below, $$(Ba, Bi, A)(Ti, Fe, M)O_3 \quad (P)$$

wherein, in General Formula (P), Ba, Bi, and A are A-site elements and Ti, Fe, and M are B-site elements, each of A and M being one or more types of metal elements other than Pb and AMO$_3$ in the General Formula (P) excludes BaTiO$_3$ and BiFeO$_3$,
    wherein the piezoelectric body is a particle oriented ceramics sintered body.

2. A piezoelectric actuator, comprising the piezoelectric device of claim 1 and a driver for driving the piezoelectric device by applying an electric field to the piezoelectric body of the piezoelectric device.

3. The piezoelectric actuator of claim 2, further comprising a vibration plate, provided in a lower layer of the piezoelectric body, for conveying displacement occurred in the piezoelectric body, when driven, to the outside.

4. A liquid discharge apparatus, comprising:
    the piezoelectric actuator of claim 2; and
    a liquid discharge member provided adjacent to the piezoelectric actuator,
    wherein the liquid discharge member has a liquid storage chamber for storing a liquid and a liquid discharge opening for discharging the liquid from the liquid storage chamber to the outside according to the application of the electric field to the piezoelectric body.

5. A power generating apparatus, comprising the piezoelectric device of claim 1 with a vibration plate, provided in a lower layer of the piezoelectric body, for conveying an external force to the piezoelectric body to displace the body, and an extraction electrode for extracting a charge generated in the piezoelectric body by the displacement from the pair of electrodes.

TABLE 2

| | Composition | Substrate | $\epsilon$ | d(pm/V) | g(×10$^{-3}$ V·m/N) |
|---|---|---|---|---|---|
| Example 1-(1) | (Ba$_{0.2}$,Bi$_{0.8}$)(Ti$_{0.19}$,Fe$_{0.76}$,Mn$_{0.05}$)O$_3$ | STO(100) | 115 | 183 | 180 |
| Example 1-(2) | (Ba$_{0.3}$,Bi$_{0.7}$)(Ti$_{0.29}$,Fe$_{0.66}$,Mn$_{0.05}$)O$_3$ | STO(100) | 140 | 171 | 138 |
| Example 2-(1)' | (Ba$_{0.2}$,Bi$_{0.8}$)(Ti$_{0.19}$,Fe$_{0.76}$,Mn$_{0.05}$)O$_3$ | Si(100) | 250 | 244 | 110 |
| Example 2-(2)' | (Ba$_{0.3}$,Bi$_{0.7}$)(Ti$_{0.29}$,Fe$_{0.66}$,Mn$_{0.05}$)O$_3$ | Si(100) | 300 | 220 | 83 |
| Example 3-(3) | (Ba$_{0.15}$,Bi$_{0.8}$,Sr$_{0.05}$)(Ti$_{0.19}$,Fe$_{0.76}$,Mn$_{0.05}$)O$_3$ | STO(100) | 122 | 266 | 246 |
| Example 3-(4) | (Ba$_{0.2}$,Bi$_{0.8}$)(Ti$_{0.15}$,Fe$_{0.75}$,Nb$_{0.05}$,Mn$_{0.05}$)O$_3$ | STO(100) | 136 | 238 | 198 |
| Example 4-(3)' | (Ba$_{0.15}$,Bi$_{0.8}$,Sr$_{0.05}$)(Ti$_{0.19}$,Fe$_{0.76}$,Mn$_{0.05}$)O$_3$ | Si(100) | 292 | 282 | 109 |
| Example 4-(4)' | (Ba$_{0.2}$,Bi$_{0.8}$)(Ti$_{0.15}$,Fe$_{0.75}$,Nb$_{0.05}$,Mn$_{0.05}$)O$_3$ | Si(100) | 312 | 292 | 106 |

The piezoelectric device of the present invention is preferably applied to piezoelectric actuators mounted on inkjet recording heads, magnetic read/write heads, MEMS (micro electro-mechanical systems) devices, micropumps, and ultrasonic probes, as well as sensors, ultrasonic sensors, ferroelectric memories, and the like.

\* \* \* \* \*